US012763764B2

(12) United States Patent
Qu et al.

(10) Patent No.: US 12,763,764 B2
(45) Date of Patent: Oct. 13, 2026

(54) CASCODE SWITCHING MODULE

(71) Applicant: NEXPERIA B.V., Nijmegen (NL)

(72) Inventors: Yong Qu, Manchester (GB); Joel Turchi, Paris (FR); Katarzyna Nowak, Nijmegen (NL); Ricardo Yandoc, Manchester (GB)

(73) Assignee: Nexperia B.V., Nijmegen (NL)

( * ) Notice: Subject to any disclaimer, the term of this patent is extended or adjusted under 35 U.S.C. 154(b) by 210 days.

(21) Appl. No.: 18/522,897

(22) Filed: Nov. 29, 2023

(65) Prior Publication Data

US 2024/0178831 A1 May 30, 2024

(30) Foreign Application Priority Data

Nov. 29, 2022 (EP) .................................... 22210202

(51) Int. Cl.

*H02M 3/335* (2006.01)
*H02M 1/08* (2006.01)
*H02M 1/42* (2007.01)
*H03K 17/0812* (2006.01)
*H03K 17/08* (2006.01)

(52) U.S. Cl.

CPC ........ *H03K 17/08122* (2013.01); *H02M 1/08* (2013.01); *H02M 1/4208* (2013.01); *H02M 3/33584* (2013.01); *H03K 2017/0806* (2013.01)

(58) Field of Classification Search

CPC ... H03K 2217/0027; H03K 2017/6875; H03K 2017/0806; H03K 17/6871; H03K 17/102; H03K 17/687; H03K 17/161; H03K 17/567; H03K 17/04206; H03K 17/0822; H03K 17/168; H03K 17/08122; H03K 17/063; H03K 17/08104; H03K 17/04106; H03K 17/0828; H03K 17/08142; H03K 17/16

See application file for complete search history.

(56) References Cited

U.S. PATENT DOCUMENTS 5,841,643 A * 11/1998 Schenkel .......... H02M 3/33507 363/21.16
8,248,145 B2 8/2012 Melanson
(Continued)

FOREIGN PATENT DOCUMENTS

EP 3149852 B1 7/2019

OTHER PUBLICATIONS

S. Buetow and R. Herzer, "Characterization of GaN-HEMT in cascode topology and comparison with state of the art-power devices," 2018 IEEE 30th International Symposium on Power Semiconductor Devices and ICs (ISPSD), 2018, pp. 196-199, doi: 10.1109/ISPSD.2018.8393636.
(Continued)

*Primary Examiner* — Bryan R Perez
(74) *Attorney, Agent, or Firm* — Ruggiero McAllister & McMahon LLC

(57) ABSTRACT

A cascode transistor circuit including a depletion mode semiconductor device, an enhancement mode transistor having a drain terminal connected to a source terminal of the depletion mode semiconductor device, and a gate driver coupled to a first node between the source of the depletion mode semiconductor device and the drain of the enhancement mode transistor. The gate driver is powered by the depletion mode semiconductor device.

19 Claims, 7 Drawing Sheets

(56) References Cited

U.S. PATENT DOCUMENTS

| | | | | |
|---|---|---|---|---|
| 2015/0061752 | A1* | 3/2015 | Abe | H03K 17/08122 327/427 |
| 2019/0165779 | A1* | 5/2019 | Olyunin | H02M 3/335 |
| 2019/0393871 | A1 | 12/2019 | Springett | |
| 2023/0095515 | A1* | 3/2023 | Neudorfhofer | H02P 3/22 327/427 |

OTHER PUBLICATIONS

Y. Wen, M. Rose, R. Fernandes, R. Van Otten, H. J. Bergveld and O. Trescases, “A Dual-Mode Driver IC With Monolithic Negative Drive-Voltage Capability and Digital Current-Mode Controller for Depletion-Mode GaN HEMT,” in IEEE Transactions on Power Electronics, vol. 32, No. 1, pp. 423-432, Jan. 2017, doi: 10.1109/TPEL.2016.2537002.

Huang, W. Du, F. C. Lee, Q. Li and Z. Liu, “Avoiding Si MOSFET Avalanche and Achieving Zero-Voltage Switching for Cascode GaN Devices,” in IEEE Transactions on Power Electronics, vol. 31, No. 1, pp. 593-600, Jan. 2016, doi: 10.1109/TPEL.2015.2398856.

T. Sugiyama et al., “Stable cascode GaN HEMT operation by direct gate drive,” 2020 32nd International Symposium on Power Semiconductor Devices and ICs (ISPSD), 2020, pp. 22-25, doi: 10.1109/ISPSD46842.2020.9170130.

* cited by examiner

CASCODE SWITCHING MODULE

CROSS-REFERENCE TO RELATED APPLICATIONS

This application claims the benefit under 35 U.S.C. § 119(a) of European Application No. 22210202.2 filed Nov. 29, 2022, the contents of which are incorporated by reference herein in their entirety.

BACKGROUND

1. Field of the Disclosure

The present application relates to a cascode switching module, particularly but not exclusively, the application relates to a switching module comprising a normally-on GaN semiconductor device coupled with a normally-off MOSFET.

2. Description of the Related Art

The large band gap, high breakdown voltage, and fast switching properties of Gallium Nitride (GaN) make it an ideal candidate for use in high-power semiconductor devices and at high temperatures. GaN high electron mobility transistors (HEMTs) are almost always normally-on devices, also referred to as depletion mode devices. This means they are highly conductive, or in ON-state, when zero voltage is applied to the control terminal or gate.

Normally-on devices can be difficult to apply in many power conversion or switching applications. Cascode circuits include a low voltage normally-off Metal Oxide Semiconductor Field Effect Transistor (MOSFET) connected in series with a high voltage normally-on HEMT and therefore provide a module having a normally-off operation mode when zero voltage is applied to its control terminal, the MOSFET gate. A cascode device, being a composite circuit, contains many parasitic inductances from device bonding wires, package leads, and PCB traces. These parasitic inductances together with the difference in capacitance of the two devices in the cascode module can cause oscillations during switching processes and result in instabilities under certain conditions.

FIG. 1 shows an example state-of-the-art cascode GaN device. FIG. 1 shows a depletion-mode Gallium Nitride (d-GaN) HEMT which is chip-to-chip connected with a silicon MOSFET located over the GaN HEMT. As the gate and source of the GaN device are individually connected with the source and drain of the MOSFET in a cascode configuration, the GaN device can be indirectly turned off by turning off the MOSFET device.

In the device shown, when the GaN device is indirectly turned off by turning off the MOSFET device, then a middle point voltage $V_M$ reaches the absolute value of the GaN threshold voltage $V_{TH}$ (e.g., −20V) because $V_M$=$-V_{GS}$ (of the GaN device).

Due to the package parasitic impedance and the capacitance mismatch between the cascode GaN and MOSFET devices, $V_M$ often suffers from overshoots which may introduce reliability degradation of the GaN gate. To reduce the reliability degradation, a large capacitor, $C_X$, is often integrated into the MOSFET die to mitigate the middle point voltage overshoot during the turn-off period but also reduce the risk of unwanted cascode turn-on events due to oscillations across the cascode voltage. However, the energy stored in the capacitor $C_X$ gets directly dissipated on the MOSFET channel during the turn-on moment and the benefits arising from the GaN device are diminished if all these provisions need to be added. Consequently, there is a trade-off between reducing overshoot and reducing power losses. A larger capacitor $C_X$ leads to a reduced $V_M$ overshoot, however increases the size of chip required and increases power loss, where the power loss can be derived as $$C_X \cdot V_M^2 \cdot f_{SW},$$

where $f_{SW}$ represents the switching frequency.

Moreover, as the leakage current of the GaN device in the off state is typically higher than the MOSFET, a bleeder resistor $R_X$ is integrated into the MOSFET die to sink the GaN leakage current, which undesirably compromises efficiency.

FIG. 2 shows a state-of-the-art AC-DC totem pole solution, including two cascode devices and two types of galvanic isolators for both power delivery and signal transfer. In general, a totem-pole power factor correction (PFC) stage is a converter designed to provide an output DC voltage while drawing a sinusoidal current in phase with the line voltage from the grid so that the power factor is nearly 1. A totem-pole PFC stage adapts its functioning to the line polarity using two legs: a fast leg, including the two cascode devices that controls the current within the inductor L, and a slow leg which provides the current return path through S1 or S2 depending on the line polarity. In the example of FIG. 2 the fast leg is controlled by a microcontroller. However, the microcontroller cannot directly turn on and off the fast leg switches as its current capability is generally insufficient for an efficient drive, and for safety reasons the microcontroller must be galvanically isolated from the switches it controls.

In the example device of FIG. 2, optocouplers are used for isolation and gate drivers to ensure the drive current is sufficient. The two gate drivers need to be powered. This is done by the isolated converter that provides supply voltages $V_{CCH}$ and $V_{CCL}$.

The converter typically suffers from larger parasitic capacitance and lower insulation level between different windings. Hence, the switching noise of the cascode device in the high voltage side of the system can be easily coupled to the low voltage microcontroller side and a potentially large common mode noise could be generated between two different circuit grounds due to their shared chassis. As such, the flyback converter complicates the hardware implementation and compromises Common Mode Noise Immunity (CMTI) performance.

US 2019/0393871 A1, EP 3 149 852 B1, and U.S. Pat. No. 8,248,145 B2 relate to a cascode modules. T. Sugiyama et al., "*Stable cascode GaN HEMT operation by direct gate drive,*" 2020 32nd International Symposium on Power Semiconductor Devices and ICs (ISPSD), 2020, pp. 22-25, doi: 10.1109/ISPSD46842.2020.9170130, S. Buetow and R. Herzer, "*Characterization of GaN-HEMT in cascode topology and comparison with state of the art-power devices,*" 2018 IEEE 30th International Symposium on Power Semiconductor Devices and ICs (ISPSD), 2018, pp. 196-199, doi: 10.1109/ISPSD.2018.8393636., Y. Wen, M. Rose, R. Fernandes, R. Van Otten, H. J. Bergveld and O. Trescases, "*A Dual-Mode Driver IC With Monolithic Negative Drive-Voltage Capability and Digital Current-Mode Controller for Depletion-Mode GaN HEMT,*" in IEEE Transactions on Power Electronics, vol. 32, no. 1, pp. 423-432, January 2017, doi: 10.1109/TPEL.2016.2537002, and X. Huang, W. Du, F. C. Lee, Q. Li and Z. Liu, "*Avoiding Si MOSFET Avalanche and Achieving Zero-Voltage Switching for Cascode GaN Devices*," in IEEE Transactions on Power Electronics, vol. 31, no. 1, pp. 593-600, January 2016, doi: 10.1109/TPEL.2015.2398856 relate to further cascode switching modules.

Many state-of-the-art cascode modules are unsuitable for use with depletion mode GaN power devices. State-of-the-art cascode systems including GaN devices suffer from the following disadvantages:

The use of an additional, external gate driver and auxiliary power source for the gate driver compromises CMTI performance, introduces large loop inductance and complicates hardware implementation.

The integrated capacitor $C_X$ on the MOSFET die compromises power efficiency as its energy gets directly dissipated on MOSFET channel once it is turned on.

A larger $C_X$ leads to a reduced voltage overshoot, however this increases power loss of the device and requires a larger silicon chip size for the MOSFET.

The implemented bleeder resistor $R_X$ can be used to sink the GaN leakage current, however, this generates further losses.

As the GaN gate is shorted with package thermal pad, an expensive wafer-through process is employed.

SUMMARY

In general, the present disclosure proposes to overcome at least some of the above problems by providing a cascode switching module that includes a normally-on power semiconductor (this may be a depletion-mode GaN HEMT), a normally-off semiconductor device (this may be a low-voltage MOSFET) and a gate driver. The module can amplify a pulse-width modulation (PWM) signal for high voltage and high current power switching, and has improved power efficiency, enhanced system reliability, and simplified hardware implementation.

Aspects and preferred features are set out in the accompanying claims.

According to a first embodiment, there is provided a cascode transistor circuit comprising:

- a depletion mode semiconductor device;
- an enhancement mode transistor having a drain terminal connected to a source terminal of the depletion mode semiconductor device; and
- a gate driver coupled to a first node between the source of the depletion mode semiconductor device and the drain of the enhancement mode transistor, wherein the gate driver is powered by the depletion mode semiconductor device.

The gate driver may be powered by an energy harvesting mechanism, wherein the energy harvesting mechanism may be configured to collect energy from the first node.

As the gate driver can be co-packaged with the enhancement mode transistor it drives, the distance between the gate driver and the enhancement mode transistor can be minimized. Thus, parasitic inductances and switching noise are reduced, and gate-driving loops can be substantially minimized.

The circuit may further comprise a first capacitor coupled between the gate driver and the source of the cascode transistor circuit. The first capacitor may be configured to store energy received from the depletion mode semiconductor device when the enhancement mode transistor is in the off-state. The first capacitor may provide a voltage source for the gate driver.

The module may include a gate driver supply generation mechanism that prevents unwanted turn-on events of the depletion mode device, by controlling a midpoint voltage and utilizing the energy from a capacitor coupled to the midpoint to power gate driver circuits. This improves power efficiency of the cascode module.

The depletion mode semiconductor device may be referred to as a normally-on device. The depletion mode semiconductor device may comprise a GaN field effect transistor. The depletion mode semiconductor device may comprise a GaN high-electron-mobility transistor. Alternatively, the depletion mode semiconductor device may comprise a silicon carbide (SiC) device. The depletion mode semiconductor device may comprise a MOSFET.

The cascode switching module allows the beneficial properties of using a GaN power device (such as a large band gap, high breakdown voltage, and fast switching properties), with reduced performance compromises compared to state-of-the-art modules.

A gate terminal of the depletion mode device may be coupled with a source terminal of the enhancement mode transistor device.

The gate driver may be further coupled to a gate terminal of the enhancement mode transistor device.

The enhancement mode transistor may be referred to a normally-off device. The enhancement mode transistor device may comprise a Silicon MOSFET.

The gate driver may comprise a first diode coupled between the first node and the first capacitor.

The cascode transistor circuit may further comprise a switch coupled between the first node and the first capacitor. The switch may be connected in parallel with the first diode.

The gate driver may include a first diode and a switch that allow the midpoint voltage to be controlled. This reduces spikes and overshoots of the midpoint voltage, enhancing reliability of the cascode module. The switch may be connected in parallel with the first diode. The capacitor can be charged by the diode and discharged by the switch and gate driver circuits.

The cascode transistor circuit may further comprise a first resistor connected between the first node and the switch.

A gate of the depletion mode semiconductor device may be biased by a negative power rail. The gate of the normally-on power device can be actively biased by a negative voltage. This may be provided by an active gate voltage bias circuit and allows a midpoint voltage level to be controlled.

The cascode transistor circuit may further comprise a Zener diode connected in parallel to the first capacitor and configured to limit the voltage on the first capacitor.

The depletion mode semiconductor device, the enhancement mode transistor, and the gate driver may be formed in more than one package.

Alternatively, the depletion mode semiconductor device, the enhancement mode transistor, and the gate driver may be formed in a single package. The package may be referred to a cascode switching module. The depletion mode semiconductor device, the enhancement mode transistor, and the gate driver may be formed on a single chip. The first capacitor may be formed on the gate driver die or on the depletion mode semiconductor device die.

The first capacitor may be formed in a separate package to the depletion mode semiconductor device, the enhancement mode transistor, and the gate driver.

Alternatively, the first capacitor may be formed in a single package with the depletion mode semiconductor device, the enhancement mode transistor, and the gate driver.

The cascode transistor circuit may further comprise a current sensor formed in the single package. The current sensor may be powered by the depletion mode semiconductor device.

The cascode transistor circuit may further comprise a temperature sensor formed in the single package. The temperature sensor may be configured to measure a temperature of the package. The use of an in-situ gate driver supply generation mechanism allows current-sensing and temperature-monitoring functions to be provided in the module.

According to a further embodiment of the disclosure, there is provided an AC-DC converter comprising one or more cascode transistor circuits as described above.

According to a further embodiment of the disclosure, there is provided a method of manufacturing a cascode transistor circuit, the method comprising:

- forming a depletion mode semiconductor device;
- forming an enhancement mode transistor having a drain terminal connected to a source terminal of the depletion mode semiconductor device; and
- forming a gate driver coupled to a first node between the source of the depletion mode semiconductor device and the drain of the enhancement mode transistor, wherein the gate driver is powered by the depletion mode semiconductor device.

The cascode switching module may comprise a drain terminal, a source terminal and a high-impedance pulse-width modulation (PWM) input, and therefore can be provided in a package with as few as three pins. The module may be integrated in a package with additional pins for auxiliary/protection/monitoring functions. Furthermore, as no external gate driver power supply is needed, the hardware required can be simplified.

In state-of-the-art systems, the power source for the gate driver provides another connection between the microcontroller (MCU) ground and the switch ground and may affect the CMTI performance. As a power source is not required to power the gate driver in the system as herein disclosed, a microcontroller may only be connected to the cascode module through the isolation element which provides the PWM signal. Therefore, the internal gate driver supply generation mechanism can inherently provide galvanic isolation which is beneficial to Common Mode Transient Immunity (CMTI) performance improvement.

The proposed device provides the following advantages:

- The cascode switching module utilises the beneficial properties of using a GaN power device, such as high breakdown voltage and fast switching.
- The cascode module includes additional monitoring and protection features including overcurrent and overtemperature protections.
- The cascode switching module has a controllable mid-point voltage.
- The cascode module can be formed in a package having only three terminal pins
- The internal gate driver supply generation mechanism simplifies hardware implementation, improves power efficiency, reduces form factor, and reduces cost.
- The generated voltage supply features inherent galvanic isolation which desirably improves CMTI performance. This is beneficial to high dV/dt applications.
- The cascode module may include an integrated current sensor to enable zero current detection and overcurrent protection
- The cascode module may include an integrated temperature monitor to offer overtemperature protection
- The cascode module minimises loop inductance package parasitic impedance in order to support high-speed switching and power density improvement
- The cascode module is configurable with 3-pin and 12-pin packages.

BRIEF DESCRIPTION OF THE DRAWINGS

Some embodiments of the disclosure will now be described, by way of example only and with reference to the accompanying drawings, in which.

DETAILED DESCRIPTION

Figure 3:
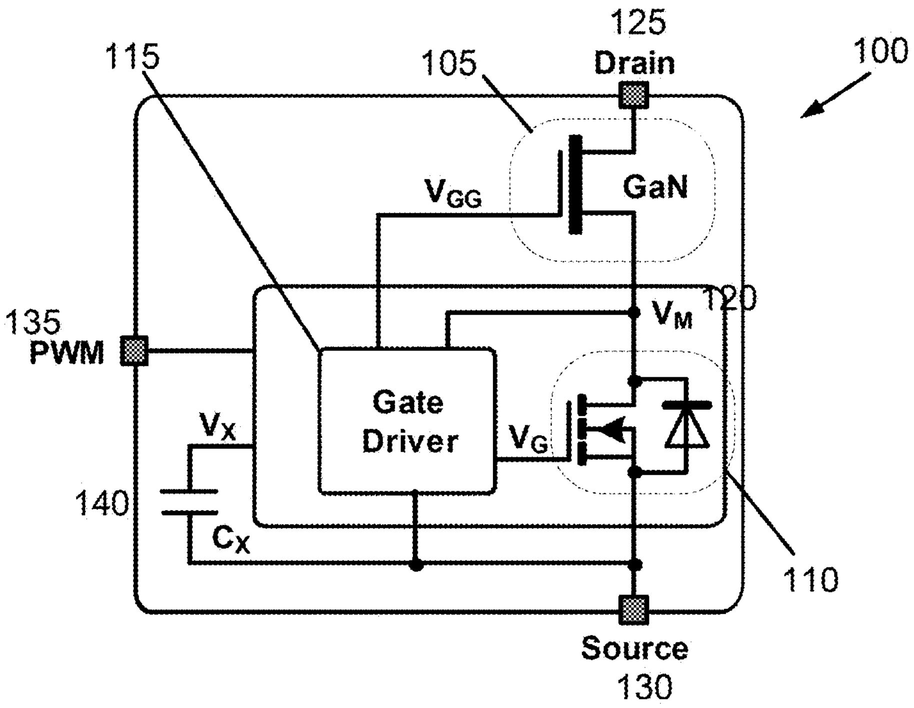
FIG. 3 illustrates a self-powered self-protected switching cascode module according to an embodiment of the disclosure.

FIG. 3 illustrates a self-powered self-protected switching cascode module 100 according to an embodiment of the disclosure. The switching module 100 can be configured to be provided in a 3-pin package. The cascode switching module can amplify a pulse width modulation (PWM) signal provided at a gate 135 into a high voltage and high current switching with significantly improved user-friendliness and reduced package parasitic impedance.

The cascode module 100 includes a normally-on GaN device 105 connected in series with a normally-off silicon MOSFET 110. In some embodiments, the normally-on GaN device 105 may be a field-effect transistor (FET) or a high-electron-mobility transistor (HEMT). Whilst the example shown relates to a GaN device, the normally-on device 110 may be a different semiconductor device such as a SiC device. A capacitor, $C_X$, 140 is connected between the gate driver 115 and the source 130. The capacitor 140 can be either integrated into the same chip or package as the gate driver 115 or provided as a discrete component.

As the gate and source of the GaN device 105 are individually connected with the source and drain of the MOSFET 110 in a cascode configuration, the GaN device 105 can be indirectly turned off by means of turning off the MOSFET 110.

Figure 4:
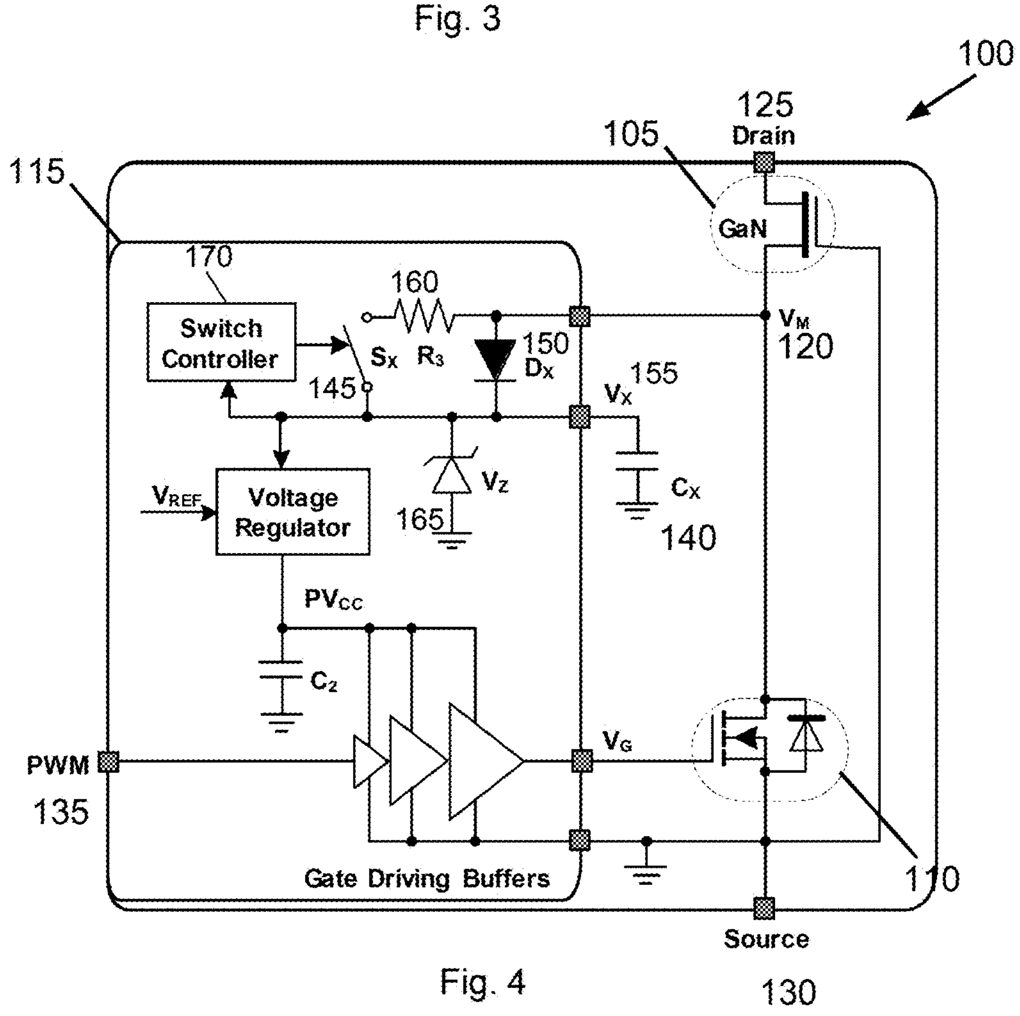
FIG. 4 shows a schematic diagram of an alternative cascode switching module, according to an embodiment of the disclosure.

FIG. 4 shows a schematic diagram of an alternative cascode switching module, according to an embodiment of the disclosure. Many of the features are the same as those shown in FIG. 3 and therefore share the same reference numerals. The module includes a bidirectional switch, $S_X$, 145 and a unidirectional diode, $D_X$, 150 connected between $C_X$ 140 and the midpoint voltage, $V_M$, 120. The active switch, $S_X$ 145 is connected in parallel with the passive diode $D_X$ 150. The capacitor $C_X$ 140 can be charged and discharged by the switch and diode and gate driver circuits.

Due to the use of the switch $S_X$ 145 and diode $D_X$ 150, the trade-off between reducing overshoot by increasing the capacitance of $C_X$ 140 and reducing power losses is decoupled because the stored energy in $C_X$ 140 can instead be utilized to power gate driver circuits instead of MOSFET channel dissipation.

The midpoint voltage, $V_M$, 120 is the drain voltage of the normally-off silicon MOSFET 110. The gate-source voltage ($V_{gs}$) of the normally-on GaN device 105 is equal to the negative of the midpoint voltage, $V_M$ such that $V_M = -V_{gs}$. In the device shown in FIG. 5, the voltage of the midpoint ($V_M$) is nearly or substantially zero volts when the cascode switching module is on and conducting, is at a higher voltage (for example, 25 or 30 V) when the cascode switching module is off. When the cascode switching module is off, the midpoint voltage, $V_M$, increases such that the gate-source voltage ($V_{gs}$) of the normally-on GaN device 105 is lower than the (negative) threshold $V_{gs,th}$ required to switch off the normally-on GaN device 105.

When the cascode switching module turns off, the midpoint voltage, $V_M$, 120 increases (e.g. the midpoint voltage, $V_M$, 120 may increase to 25 V) such that the gate-source voltage of the normally-on GaN device 105 is low enough to turn off. The diode, $D_X$, 150, allows current to flow to the capacitor $C_X$ 140 to charge to the midpoint voltage, $V_M$, level (minus the diode voltage drop). Hence, the diode, $D_X$, 150 allows energy harvesting. In addition, the diode, $D_X$, 150 and the capacitor, $C_X$, 140 clamp the midpoint voltage, $V_M$, and prevent the normally-off silicon MOSFET 110 from avalanching.

Specifically, when the MOSFET 110 is turned off and $V_M > (-V_{gs,th})$, the voltage of the midpoint, $V_M$, 120 starts to increase until it goes beyond the predetermined voltage $(-V_{gs,th})$ up to a level depending on the package parasitic inductance and as dictated by the respective parasitic capacitances of the GaN and MOSFET devices 105, 110. The potential $V_M$ 120 overshoot gets significantly reduced by the capacitor, $C_X$, 140 and thus limits the MOSFET 110 voltage rise and hence, the risk of MOSFET avalanche. As $C_X$ 140 can be realized as an off-chip device, its capacitance can be much larger than an integrated capacitor (e.g., the capacitance may be 1 uF for an off-chip capacitor rather than 1 nF for an integrated capacitor) without the concern of efficiency compromise.

To switch the normally-on GaN device 105 off, the midpoint voltage, $V_M$, 120 must exceed $-V_{gs,th}$. This means that the midpoint voltage, $V_M$, will increase to at least $-V_{gs,th}$ (in practise, it may go a bit higher than $-V_{gs,th}$). The capacitor, $C_X$, 140 may therefore charge to approximately $-V_{gs,th}$, although it may be a bit lower due to the voltage drop of the diode, $D_X$, 150 (which may be about 0.7 V). The charged energy of the capacitor, $C_X$, 140 can be recycled to power the gate driver 115 operation instead of generating losses on the MOSFET 110 turn-on channel. By this mechanism, a gate driver power source $V_X$ is internally generated, and the trade-off between reducing overshoot by increasing the capacitance of $C_X$ 140 and increasing power losses is decoupled.

The cascode switching module can be used for some resonant converter applications (e.g., an LLC converter). To avoid undesired turn-on of the GaN device 105 when its drain voltage is oscillating, a bidirectional switch $S_X$ 145 and a resistor $R_3$ 160 are used in the gate driver 115. The resistor 160 is connected between the voltage midpoint $V_M$ 120 and the switch $S_X$ 145. When the switching node $V_M$ (i.e., the drain of the GaN device 105) is purposefully oscillating and its voltage is lower than the gate driver power source $V_X$ 155, the switch $S_X$ 145 is turned on to provide a curtain voltage for the middle point $V_M$ 120, and thus the GaN device 105 is in an off-state. The resistor $R_3$ 160 limits the discharging current from the capacitor $C_X$ 140 to the voltage midpoint $V_M$ 120 and subsequently, the switch controller 170 turns off the switch $S_X$ 145. The switch $S_X$ 145 limits the midpoint voltage, $V_M$, drop when the cascode switching module is used in a resonant application as the drain voltage can oscillate, thus preventing the switching cascode module from turning on while undesired.

Alternatively, the switch $S_X$ 145 is systematically turned on just after the turn-off of the cascode devices to maintain a minimum midpoint voltage $V_M$ 120 and thus prevent unexpected turn-on of the GaN device 105 due to switching node oscillations. The current capability of switch $S_X$ 145 is limited by the series resistor $R_3$ 160 (or by the on-state resistance of the switch $S_X$ 145) to avoid a rapid discharging of the gate drive power $V_X$ 155. If the switch $S_X$ 145 current exceeds a preset level and/or if the gate driver power source voltage $V_X$ 155 or the midpoint voltage $V_M$ 120 drops below a preset level (e.g. 7V for $V_X$, or 5V for $V_M$), the switch $S_X$ 145 is immediately turned off to stop the action of opposing midpoint voltage $V_M$ drop which leads to the undesired turn-on of the cascode module 100.

A large negative current may flow within the cascode switching module when the current transitions from one cascode switching module to another or in bidirectional converters. In such case, this current will drop the midpoint voltage $V_M$. The switch $S_X$ 145 current is limited so that the unavailable midpoint voltage $V_M$ drop in such situations does not lead to the discharge of the capacitor $C_X$ 140. The switch $S_X$ 145 will be turned off before turn on of the normally-off silicon MOSFET 110.

As the gate driver power source $V_X$ 155 is an internal power rail, when used in a larger module, it features innate galvanic isolation between the low-voltage microcontroller and the high-voltage power stage of an application because the PWM signal of the cascode switching module is the only connection between a microcontroller, MCU, and the cascode switching module. This greatly improves safety levels (including human body touch) and simplifies hardware implementation. As no external power source is needed and the parasitic capacitance between different grounds is substantially reduced, the gate driver CMTI performance is significantly improved.

Figure 1:
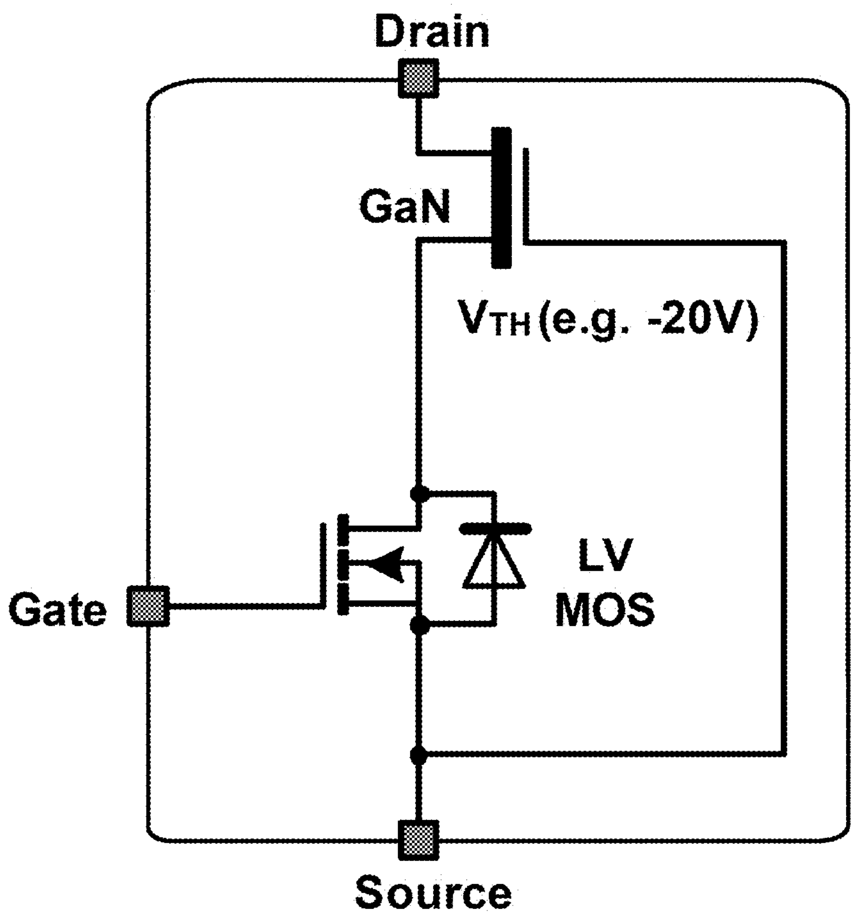
FIG. 1 shows an example cascode GaN device according to the state-of-the-art.

In comparison with the state-of-the-art device shown in FIG. 1, the proposed device does not require a bleeder resistor $R_X$, as the leakage current of the GaN device 105 can be utilized by the in-situ gate driver. A Zener diode $V_Z$ 165 is connected in parallel to the capacitor $C_X$ 140. The Zener diode may be formed within the same package as the normally-on GaN device 105 and the normally-off MOSFET 110, or may be an external component placed in parallel to the capacitor $C_X$ 140. If the consumption of the gate driver 115 is insufficient to absorb the leakage current from the GaN device 105, then integrated Zener diode $V_Z$ 165 limits the voltage on the capacitor $C_X$ 140 (i.e., the gate driver power source voltage $V_X$ 155). This is also beneficial to clamp the midpoint voltage $V_M$ 120 spikes.

In the example module of FIG. 4, there is a voltage regulator in the gate driver. This generates a dedicated supply voltage for the gate driving buffers, although other embodiments may not include a voltage regulator.

Figure 5:
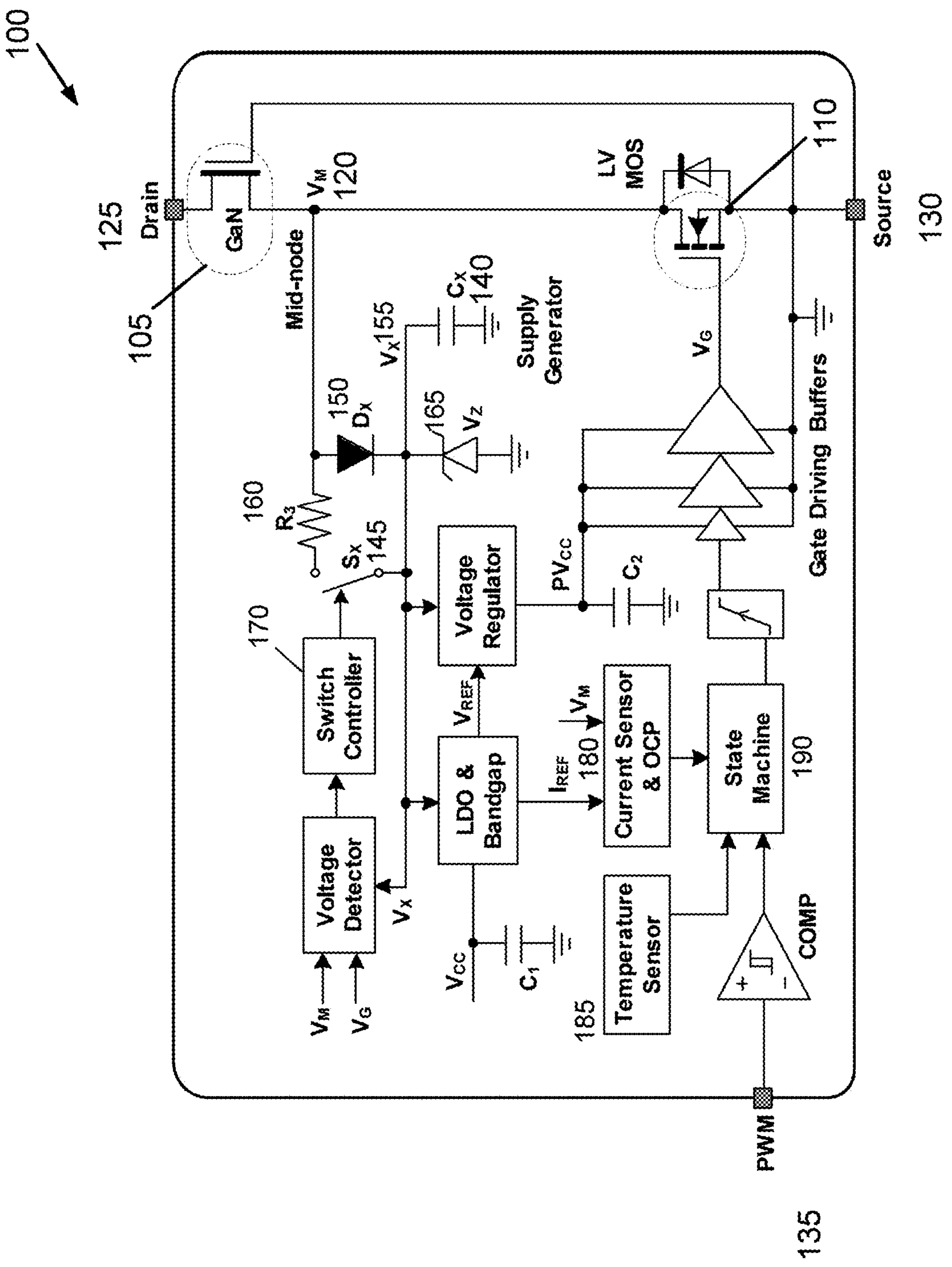
FIG. 5 shows a schematic diagram of an alternative cascode switching module according to an embodiment of the disclosure.

FIG. 5 shows a schematic diagram of an alternative cascode switching module according to an embodiment of the disclosure. Many features are similar to those shown in FIG. 4 and therefore carry similar reference numerals. As the gate driver can be formed in the same package or chip as the normally-on GaN device 105 and the normally-off silicon MOSFET 110, it is possible to sense the current in the normally-off silicon MOSFET 110 using a current sensor 180 provided in the gate driver. Similarly, a temperature sensor 185 can be placed in the gate driver to provide an indication of the temperature of the whole cascode switching module. Additionally, a state machine 190 may also be located in the gate driver, and may be used to indicate the different circuit states (e.g. fault, normal operation).

The gate driver also includes a comparator COMP that translates an input PWM signal into an internal digital signal for controlling the MOSFET 110. The comparator output is fed to the state machine 190 which, based on all its inputs, defines the state of the gate driver (e.g. a normal operation, fault handling) and generates the gate driving signal. This is shown as a state machine in FIG. 6, though other forms of control logic may be used. The gate driving signal is first level-shifted and then strengthened in the gate driving buffers. The resulting signal, which is connected to the gate terminal of the MOSFET 110, provides sufficient current capability to charge and discharge the input capacitance of the MOSFET 110 in a short time. A LDO and bandgap can be used to provide an internal supply voltage and reference voltage, respectively. The gate driver may also include a voltage detector block that is configured to determine when the switch controller 170 is to be turned on and off.

Figure 6:
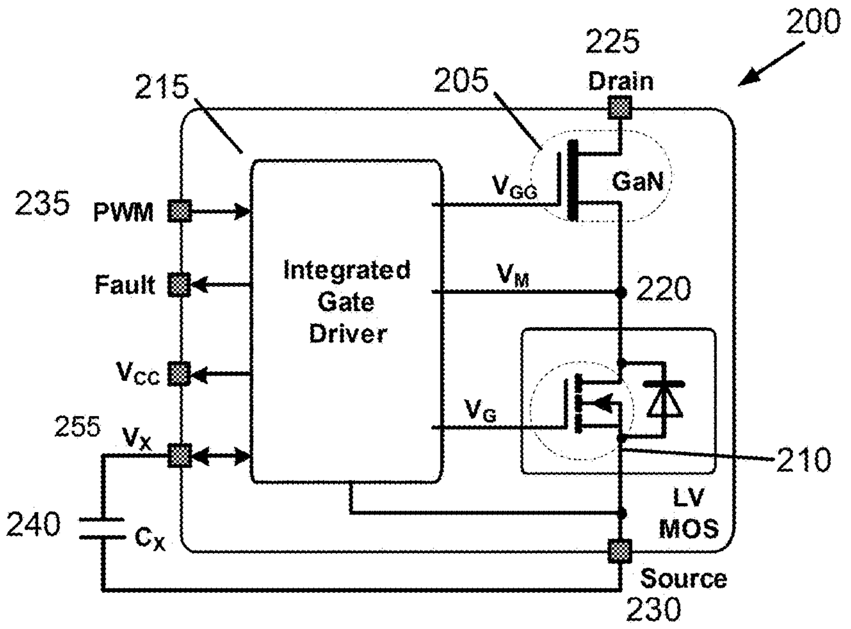
FIG. 6 illustrates an alternative self-powered self-protected switching module according to a further embodiment of the disclosure.

FIG. 6 illustrates an alternative self-powered self-protected switching module 200 according to a further embodiment of the disclosure. The switching module 200 can be configured to be provided in a 12-pin package. Instead of using a MOSFET gate clip and a GaN gate wafer-through connection, flexible bond wires may be used which maintain the electrical performance with a reduced cost. Similar to the embodiments shown in FIGS. 3 to 5, due to the in-situ gate driver IC, the gate driving loops get significantly minimized and the package parasitic impedance is desirably reduced.

Figure 7:
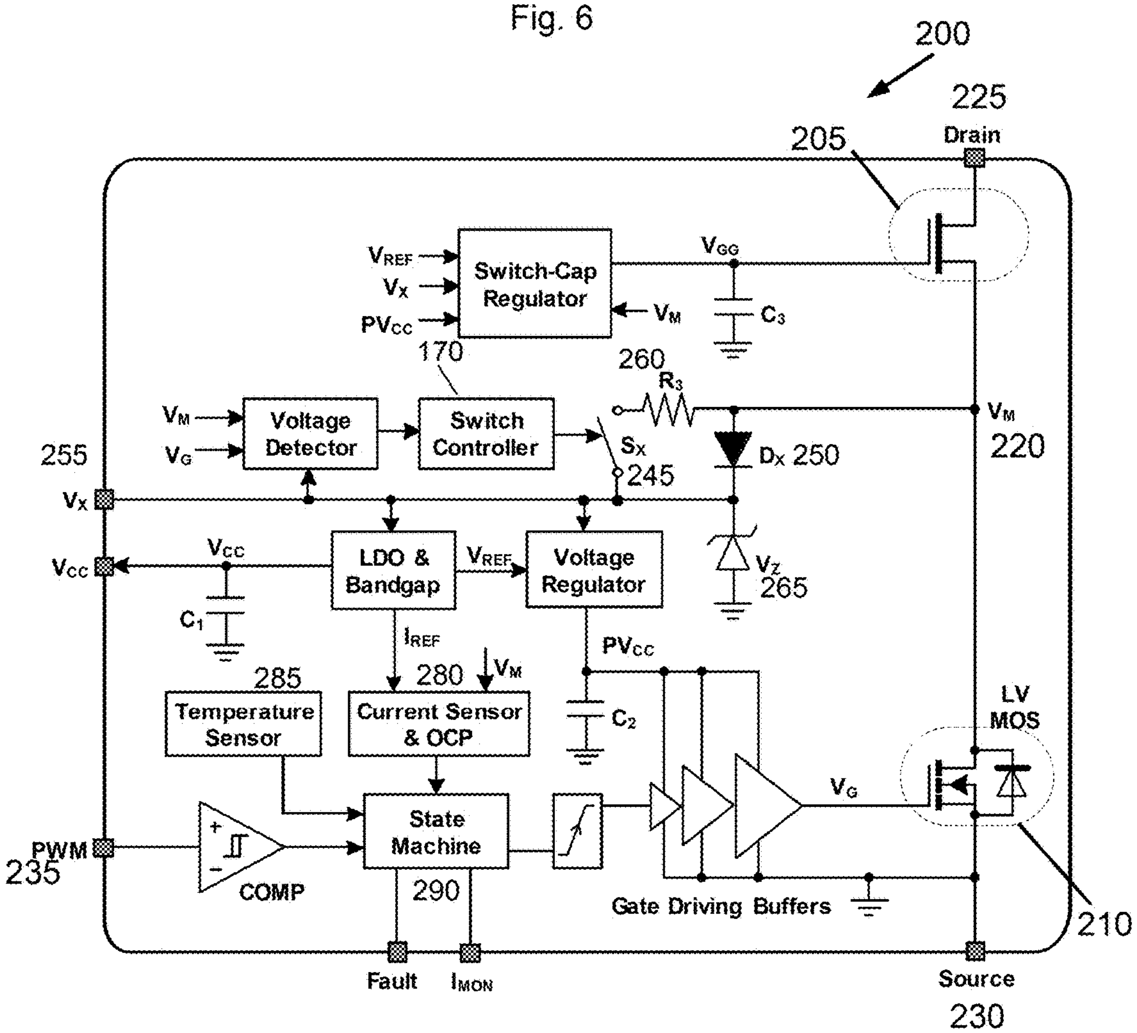
FIG. 7 shows a schematic diagram of a switching module according to an embodiment of the disclosure.

FIG. 7 shows a schematic diagram of a switching module 200, such as the cascode module shown in FIG. 6. Many of the features are similar to those shown in FIGS. 3 to 5 and therefore carry similar reference numerals.

In the embodiment shown in FIG. 7, the gate of the GaN device 205 is biased by a negative or positive power rail $V_{GG}$ (e.g., −5V). Due to the introduction of the biasing voltage $V_{GG}$, the midpoint voltage $V_M$ 220 swing is reduced, where $V_M=V_{GG}-V_{gs,th}$, resulting in a lower voltage of the internal gate driver power source $V_X$ 255. A reduced midpoint voltage $V_M$ 220 is beneficial to the MOSFET reliability enhancement and switching/conduction loss reduction as a lower voltage rating MOSFET can be used to provide a lower RDS(on) and lower gate charge. Further, it also contributes to the power efficiency improvement of the PVCC voltage regulator for gate driving buffers, and power consumption reduction of the gate driver. This allows the high switching frequency provided by the use of GaN in the GaN device 205 to be better utilised.

Based on the capacitor $C_X$ (not shown in FIG. 7, but shown in FIG. 6), an internal signal power rail $V_{CC}$ can be generated to power additional analog and mixed-signal circuits. The internal signal power rail $V_{CC}$ can be also used to power off-chip isolator receivers, which greatly simplifies hardware implementation and bill of materials (BOM) cost. In some applications where the gate driver may be unable to sustain a large voltage, it may be advantageous to use a smaller, stepped down voltage $V_{CC}$, rather than using the larger $V_X$ voltage. This allows the use of smaller voltage components in the gate driver, which is advantageous as high voltage components may be bigger, slower and generally consume more power than lower voltage components. The $V_{CC}$ voltage can also be pinned out and utilized to supply surrounding circuits.

The integrated current and temperature sensors, allow overcurrent and overtemperature protections to be realized to enhance system reliability. In this embodiment, the current sensor operation principle is based on the channel on-resistance of the normally-off silicon MOSFET 110. When the normally-off silicon MOSFET 110 of the cascode switching module is on, the voltage across the normally-off silicon MOSFET 110 is equal to RDS(on)×IL, where IL is the current flowing though the cascode switching module. Hence, by sensing this voltage (RDS(on)×IL), it is possible to deduce the current, IL.

Figure 8:
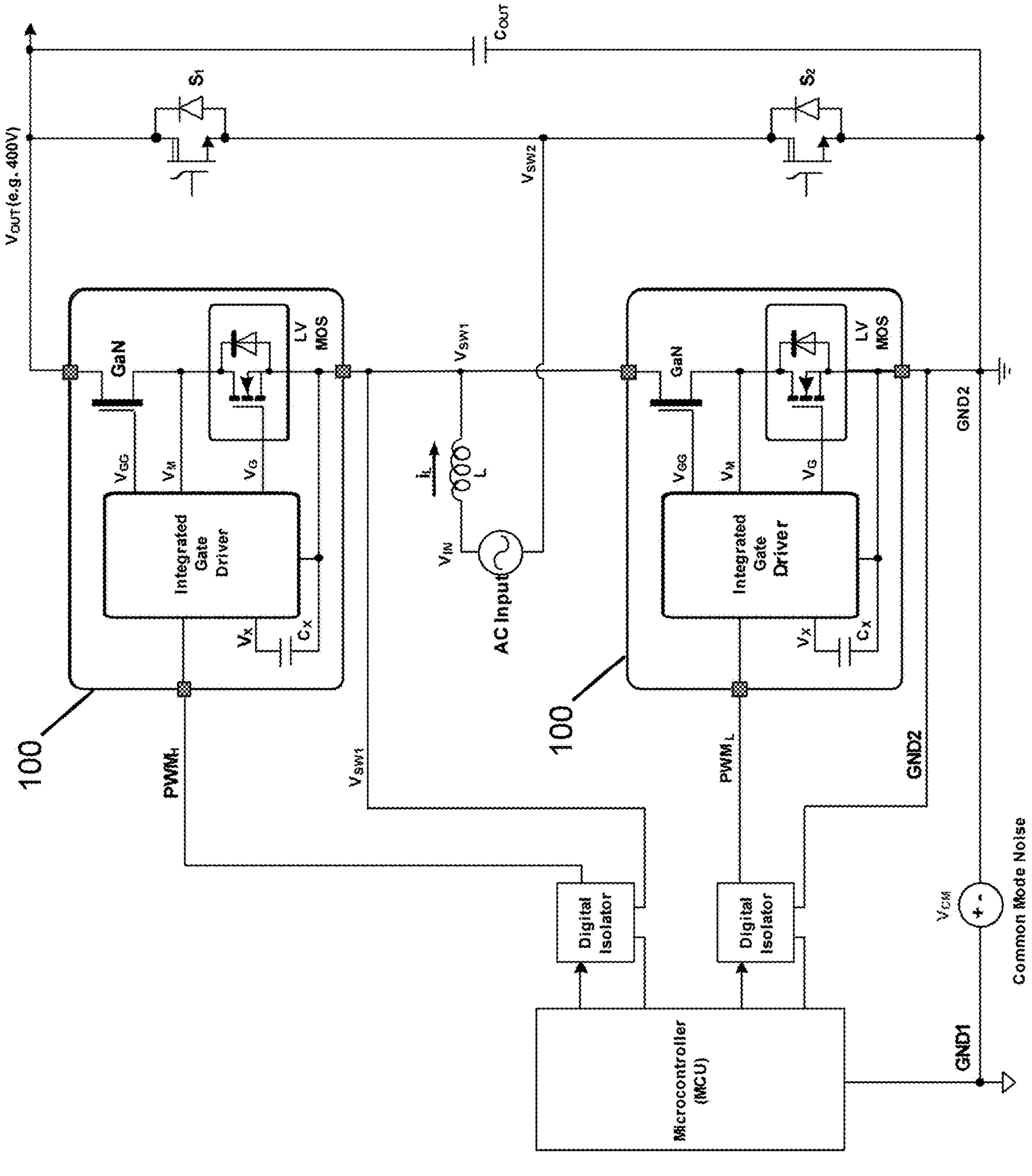
FIG. 8 shows a schematic diagram of an AC-DC totem pole system, including two cascode switching modules according to an embodiment of the disclosure.

FIG. 8 shows a schematic diagram of an AC-DC totem pole system, including two self-powered, self-protected cascode switching modules 100 according to the disclosure. In contrast to state-of-the-art systems, no transformer-based auxiliary power supplies are required as the integrated gate drivers have an internal power source driven by the GaN HEMT devices. This significantly simplifies the hardware implementation and improves the CMTI performance.

Figure 2:
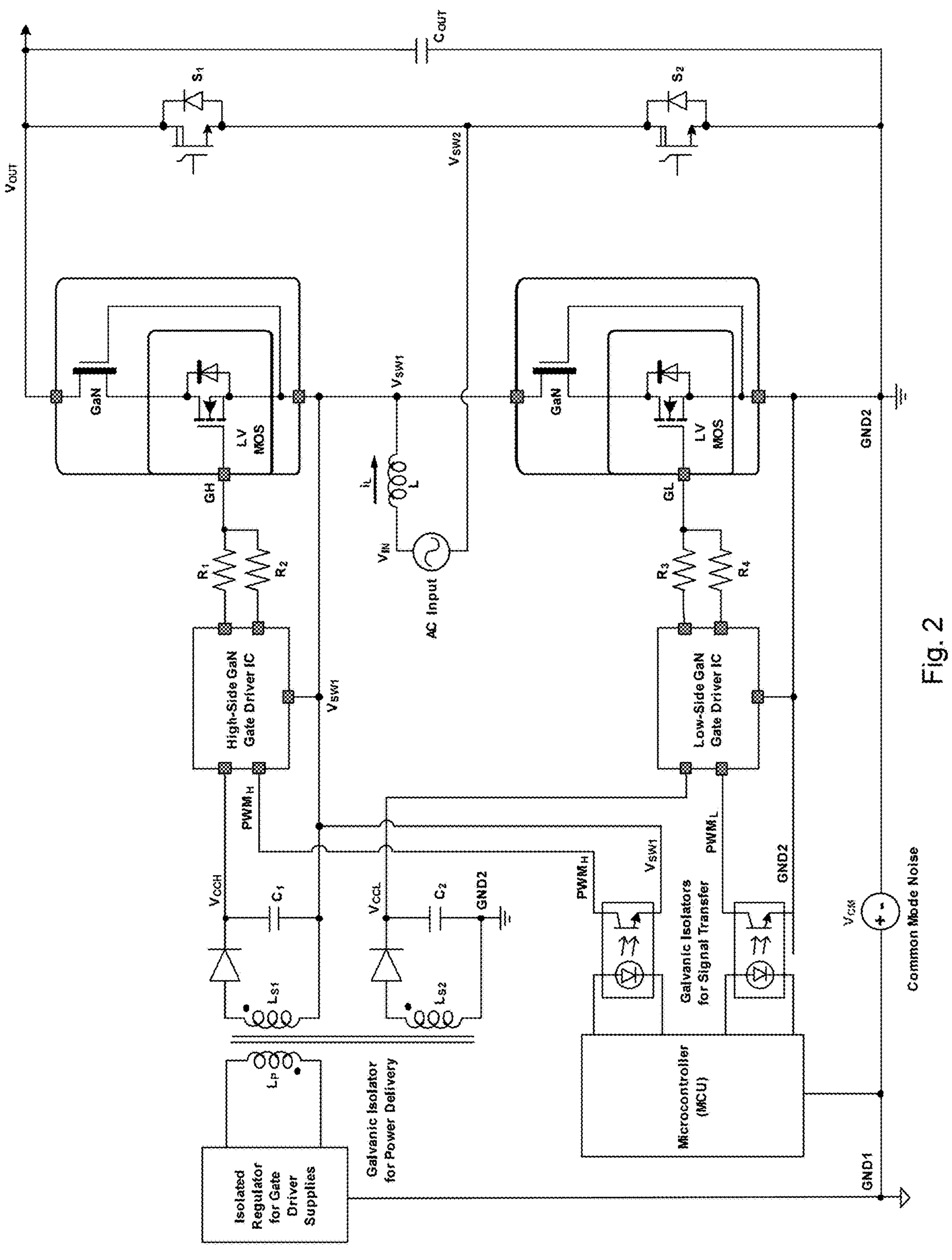
FIG. 2 shows a state-of-the-art AC-DC totem pole solution.

In comparison to state of the art AC-DC totem pole systems, such as that shown in FIG. 2, state-of-the-art cascode switches are replaced by cascode switching modules according to an embodiment of the disclosure, including a normally-on GaN device, a normally-off silicon MOSFET, and a self-powered gate driver. The use of cascode switching modules according to an embodiment of the disclosure significantly simplifies the application since the external gate drivers can be suppressed and there is no need for a converter to provide the supply voltage for the external gate drivers.

Figure 9:
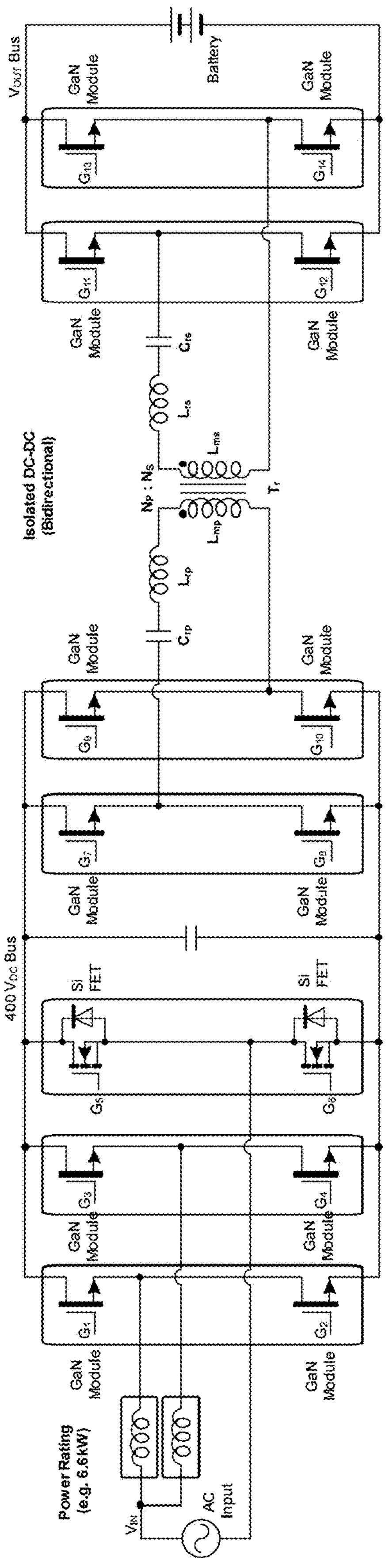
FIG. 9 shows an interleaved totem-pole PFC including cascode switching modules according to an embodiment of the disclosure.

FIG. 9 shows an interleaved totem-pole PFC including cascode switching modules according to an embodiment of the disclosure. This interleaved totem-pole PFC includes two input inductors, and switches G1, G2, G3, G4, G5 and G6 that power a 400-V bus. The switches can be cascode switching modules as described above. The PFC stage is followed by an isolated resonant converter formed by G7-G14, $C_{rp}$, $L_{rp}$, transformer $T_r$, $L_{rs}$ and $C_{rs}$, which feeds a battery. For instance, such a structure can be used in OBC (on-board chargers) used to charge the battery of electric vehicles.

Although specific embodiments have been described above, the claims are not limited to those embodiments. Each feature disclosed may be incorporated in any of the described embodiments, alone or in an appropriate combination with other features disclosed herein.

REFERENCE NUMERALS

100, 200 Cascode switching module
105, 205 GaN HEMT
110, 210 Silicon MOSFET
115, 215 Gate driver
120, 220 Voltage midpoint $V_M$
125, 225 Module drain

130, 230 Module source
135, 235 PWM input
140, 240 Capacitor $C_X$
145, 245 Switch $S_X$
150, 250 Diode $D_X$
155, 255 Gate driver power source $V_X$
160, 260 Resistor $R_3$
165, 265 Zener diode $V_Z$
170, 270 Switch controller
180, 280 Current sensor
185, 285 Temperature sensor
190, 290 State Machine

What is claimed is:

1. A cascode transistor circuit comprising:
- a depletion mode semiconductor device;
- an enhancement mode transistor having a drain terminal connected in series to a source terminal of the depletion mode semiconductor device, wherein the depletion mode device has a gate that is coupled with a source of the enhancement mode transistor device;
- a gate driver coupled to a first node between the source of the depletion mode semiconductor device and the drain of the enhancement mode transistor, wherein the gate driver is further coupled to a gate terminal of the enhancement mode transistor; and
- a first capacitor coupled between the gate driver and the source of the cascode transistor circuit, wherein the first capacitor provides a voltage source for the gate driver so that the gate driver is powered by the depletion mode semiconductor device;
  - wherein the gate driver comprises a first diode coupled between the first node and the first capacitor, and wherein the gate driver further comprises a switch coupled between the first node and the first capacitor, wherein the switch is connected in parallel with the first diode; and
  - wherein the first diode is configured to allow current to flow from the depletion mode device to the capacitor, so that the first capacitor is configured to store energy received from the depletion mode semiconductor device when the enhancement mode transistor is in the off-state.

2. The cascode transistor circuit according to claim 1, wherein the gate driver is powered by an energy harvesting mechanism, and wherein the energy harvesting mechanism is configured to collect energy from the first node.

3. The cascode transistor circuit according to claim 1, wherein the depletion mode semiconductor device comprises a GaN field effect transistor.

4. The cascode transistor circuit according to claim 1, wherein the enhancement mode transistor device comprises a Silicon MOSFET.

5. The cascode transistor circuit according to claim 1, further comprising a first resistor connected between the first node and the switch.

6. The cascode transistor circuit according to claim 1, wherein the depletion mode semiconductor device has a gate that is biased by a negative power rail.

7. The cascode transistor circuit according to claim 1, further comprising a Zener diode connected in parallel to the first capacitor and configured to limit the voltage on the first capacitor.

8. The cascode transistor circuit according to claim 1, wherein the depletion mode semiconductor device, the enhancement mode transistor, and the gate driver are formed in a single package, and wherein the depletion mode semiconductor device, the enhancement mode transistor, and the gate driver are formed on a single chip.

9. The cascode transistor circuit according to claim 8, wherein the first capacitor is formed in a separate package to the depletion mode semiconductor device, the enhancement mode transistor, and/or the gate driver.

10. The cascode transistor circuit according to claim 8, wherein the first capacitor is formed in a single package with the depletion mode semiconductor device, the enhancement mode transistor, and the gate driver.

11. The cascode transistor circuit according to claim 8, further comprising a current sensor formed in the single package, wherein the current sensor is powered by the depletion mode semiconductor device.

12. The cascode transistor circuit according to claim 8, further comprising a temperature sensor formed in the single package, wherein the temperature sensor is configured to measure a temperature of the package.

13. The cascode transistor circuit according to claim 9, further comprising a current sensor formed in the single package, wherein the current sensor is powered by the depletion mode semiconductor device.

14. The cascode transistor circuit according to claim 9, further comprising a temperature sensor formed in the single package, wherein the temperature sensor is configured to measure a temperature of the package.

15. The cascode transistor circuit according to claim 10, further comprising a temperature sensor formed in the single package, wherein the temperature sensor is configured to measure a temperature of the package.

16. The cascode transistor circuit according to claim 10, further comprising a current sensor formed in the single package, wherein the current sensor is powered by the depletion mode semiconductor device.

17. The cascode transistor circuit according to claim 11, further comprising a temperature sensor formed in the single package, wherein the temperature sensor is configured to measure a temperature of the package.

18. An AC-DC converter comprising one or more cascode transistor circuits according to claim 1.

19. A method of manufacturing a cascode transistor circuit, the method comprising the steps of:
- forming a depletion mode semiconductor device;
- forming an enhancement mode transistor having a drain terminal connected in series to a source terminal of the depletion mode semiconductor device, wherein the depletion mode device has a gate that is coupled with a source of the enhancement mode transistor device;
- forming a gate driver coupled to a first node between the source of the depletion mode semiconductor device and the drain of the enhancement mode transistor, wherein the gate driver is further coupled to a gate terminal of the enhancement mode transistor;
- forming a first capacitor coupled between the gate driver and the source of the cascode transistor circuit, wherein the first capacitor provides a voltage source for the gate driver so that the gate driver is powered by the depletion mode semiconductor device;
  - wherein the gate driver comprises a first diode coupled between the first node and the first capacitor, and wherein the gate driver further comprises a switch coupled between the first node and the first capacitor, wherein the switch is connected in parallel with the first diode; and
  - wherein the first diode is configured to allow current to flow from the depletion mode device to the capacitor, so that the first capacitor is configured to store energy received from the depletion mode semiconductor device when the enhancement mode transistor is in the off-state.

* * * * *